United States Patent
An et al.

(10) Patent No.: US 10,465,296 B2
(45) Date of Patent: Nov. 5, 2019

(54) ETCHANT COMPOSITION AND METHOD OF MANUFACTURING A THIN FILM TRANSISTOR SUBSTRATE BY USING THE SAME

(71) Applicants: Samsung Display Co., Ltd., Yongin-si (KR); Dongwoo Fine-Chem Co., Ltd., Iksan-si (KR)

(72) Inventors: Soomin An, Yongin-si (KR); Youngjun Kim, Yongin-si (KR); Hongsick Park, Yongin-si (KR); Inseol Kuk, Iksan-si (KR); Youngchul Park, Iksan-si (KR); Inho Yu, Iksan-si (KR); Seungsoo Lee, Iksan-si (KR); Jongmun Lee, Iksan-si (KR); Daesung Lim, Iksan-si (KR)

(73) Assignees: Samsung Display Co., Ltd., Yongin-si (KR); Dongwoo Fine-Chem Co., Ltd., Iksan-si (KR)

( * ) Notice: Subject to any disclaimer, the term of this patent is extended or adjusted under 35 U.S.C. 154(b) by 145 days.

(21) Appl. No.: 15/005,614

(22) Filed: Jan. 25, 2016

(65) Prior Publication Data
US 2017/0029958 A1    Feb. 2, 2017

(30) Foreign Application Priority Data
Jul. 30, 2015    (KR) .................. 10-2015-0108146

(51) Int. Cl.
*C23F 1/18*    (2006.01)
*C23F 1/26*    (2006.01)
(Continued)

(52) U.S. Cl.
CPC .................. *C23F 1/18* (2013.01); *C23F 1/26* (2013.01); *H01L 21/32134* (2013.01);
(Continued)

(58) Field of Classification Search
CPC ........ C23F 1/18; C23F 1/26; H01L 21/32134; H01L 29/76
(Continued)

(56) References Cited

U.S. PATENT DOCUMENTS 8,262,928 B2 *  9/2012  Kim .................. C23F 1/18
                                        252/79.1
8,354,288 B2 *  1/2013  Kim .................. C23F 1/18
                                        257/E33.001
(Continued)

FOREIGN PATENT DOCUMENTS

KR    10-2010-0123131    11/2010
KR    1020120015488    2/2012
(Continued)

OTHER PUBLICATIONS

Copper (II) sulfate—Wikipedia, the Free Encyclopedia via https://web.archive.org/web/20130324010516/https://en.wikipedia.org/wiki/Copper(II)_sulfate ; pp. 1-7; 2013.*

*Primary Examiner* — Binh X Tran
(74) *Attorney, Agent, or Firm* — H.C. Park & Associates, PLC

(57) ABSTRACT

An etchant composition includes an etchant composition that includes about 0.5 wt % to about 20 wt % of persulfate, about 0.01 wt % to about 2 wt % of a fluorine compound, about 1 wt % to about 10 wt % of an inorganic acid, about 0.5 wt % to about 5 wt % of a cyclic amine compound, about 0.1 wt % to about 5 wt % of a chlorine compound, about 0.1 wt % to about 10 wt % of an aliphatic sulfonic acid, about 1 wt % to about 20 wt % of an organic acid or an organic acid salt, and water based on a total weight of the etchant composition.

11 Claims, 12 Drawing Sheets

(51) Int. Cl.
*H01L 27/12* (2006.01)
*H01L 21/3213* (2006.01)
*H01L 29/49* (2006.01)

(52) U.S. Cl.
CPC ...... *H01L 27/1244* (2013.01); *H01L 27/1259* (2013.01); *H01L 29/4908* (2013.01)

(58) Field of Classification Search
USPC .... 252/79.1, 79.2, 79.3, 79.4; 216/105, 106, 216/107; 438/754
See application file for complete search history.

(56) References Cited

U.S. PATENT DOCUMENTS

| | | | |
|---|---|---|---|
| 9,127,368 B2* | 9/2015 | Kim | C23F 1/18 |
| 2005/0196671 A1* | 9/2005 | Paonessa | C07D 213/18 |
| | | | 429/200 |
| 2006/0046944 A1* | 3/2006 | Hata | G03F 7/426 |
| | | | 510/175 |
| 2011/0250754 A1* | 10/2011 | Hirano | C08G 73/00 |
| | | | 438/693 |
| 2012/0252148 A1* | 10/2012 | Park | C09K 13/08 |
| | | | 438/34 |
| 2012/0322187 A1 | 12/2012 | Choung et al. | |
| 2013/0034923 A1* | 2/2013 | Kim | C23F 1/18 |
| | | | 438/34 |
| 2014/0014615 A1* | 1/2014 | Yube | C09K 13/00 |
| | | | 216/13 |
| 2015/0004758 A1 | 1/2015 | Choung et al. | |
| 2015/0087148 A1 | 3/2015 | Kim et al. | |

FOREIGN PATENT DOCUMENTS

| | | |
|---|---|---|
| KR | 10-2012-0111636 | 10/2012 |
| KR | 1020120138290 | 12/2012 |
| KR | 1020150001524 | 1/2015 |
| KR | 1020150033821 | 4/2015 |

* cited by examiner

ETCHANT COMPOSITION AND METHOD OF MANUFACTURING A THIN FILM TRANSISTOR SUBSTRATE BY USING THE SAME

CROSS-REFERENCE TO RELATED APPLICATION

This application claims priority from and the benefit of Korean Patent Application No. 10-2015-0108146, filed on Jul. 30, 2015, which is hereby incorporated by reference for all purposes as if fully set forth herein.

BACKGROUND

Field

Exemplary embodiments relate to an etchant composition and a method of manufacturing a thin film transistor substrate by using the etchant composition.

Discussion of the Background

In general, a thin film transistor (TFT) substrate is used as a circuit board for independently driving each pixel in a liquid crystal display device or an organic light-emitting display device. The TFT substrate includes a gate line, a data line, and a TFT connected to the gate line and the data line.

Various lines and electrodes of the TFT substrate may be formed through a patterning process such as photolithography. The patterning process includes an etching process. However, the preparation process of patterning lines through the etching process is not convenient. Thus, forming lines with the desired characteristics is limited. Also, environmental pollutants may be discharged during metal etching such as water-insoluble precipitates.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an environmentally friendly etchant composition having excellent etching characteristics and a method of preparing a thin film transistor substrate by using the environmentally friendly etchant composition that prevents the generation of a water-insoluble precipitate during etching of a metal layer.

Additional aspects will be set forth in the detailed description which follows and, in part, will be apparent from the disclosure, or may be learned by practice of the inventive concept.

An exemplary embodiment discloses an etchant composition including about 0.5 wt % to about 20 wt % of persulfate, about 0.01 wt % to about 2 wt % of a fluorine compound, about 1 wt % to about 10 wt % of an inorganic acid, about 0.5 wt % to about 5 wt % of a cyclic amine compound, about 0.1 wt % to about 5 wt % of a chlorine compound, about 0.1 wt % to about 10 wt % of an aliphatic sulfonic acid, about 1 wt % to about 20 wt % of an organic acid or an organic acid salt, and water, wherein the wt % is based on a total weight of the etchant composition.

An exemplary embodiment also discloses a method of manufacturing a thin film transistor substrate including forming a first line part including a gate line and a gate electrode connected to the gate line by sequentially forming a first metal layer on a first insulating substrate and etching a part of the first metal layer with an etchant composition; forming a gate insulating layer on the first insulating substrate, forming a second line part including a data line, a source electrode connected to the data line, and a drain electrode separated from the source electrode by forming a second metal layer on the gate insulating layer and etching a part of the second metal layer with the etchant composition, forming a passivation layer on the second line part, and forming a pixel electrode connected to the drain electrode on the passivation layer, wherein the first metal layer and the second metal layer include a first layer including titanium and the first metal layer and the second metal layer include a second layer including copper, and the etchant composition includes about 0.5 wt % to about 20 wt % of persulfate, about 0.01 wt % to about 2 wt % of a fluoride compound, about 1 wt % to about 10 wt % of an inorganic acid, about 0.5 wt % to about 5 wt % of a cyclic amine compound, about 0.1 wt % to about 5 wt % of a chlorine compound, about 0.1 wt % to about 10 wt % of an aliphatic sulfonic acid, about 1 wt % to about 20 wt % of an organic acid or an organic acid salt, and water, wherein the wt % is based on the total weight of the etchant composition.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
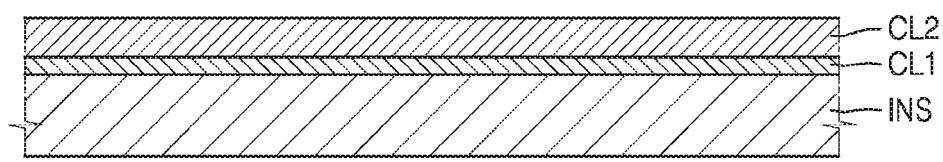
FIGS. 1, 2, 3, and 4 are cross-sectional views sequentially illustrating a method of forming a metal wire by using an etchant composition, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

According to an exemplary embodiment, an etchant composition is used in the formation of a metal wire by etching a double layer including a titanium-based metal layer and a copper-based metal layer. For example, an etchant composition may be used in the formation of a metal wire by simultaneously etching a double layer including a titanium-based metal layer and a copper-based metal layer.

The etchant composition may include about 0.5 wt % to about 20 wt % of persulfate, about 0.01 wt % to about 2 wt % of a fluorine compound, about 1 wt % to about 10 wt % of an inorganic acid, about 0.5 wt % to about 5 wt % of a cyclic amine compound, about 0.1 wt % to about 5 wt % of a chlorine compound, about 0.1 wt % to about 10 wt % of an aliphatic sulfonic acid, about 1 wt % to about 20 wt % of an organic acid or an organic acid salt, and water as the remaining amount. Also, the etchant composition may further include about 0.01 wt % to about 3 wt % of a copper compound.

Persulfate may be a main ingredient that etches copper or a copper-based metal layer including copper, and the persulfate may include at least one selected from the group consisting of potassium persulfate ($K_2S_2O_8$), sodium persulfate ($Na_2S_2O_8$), and ammonium persulfate ($(NH_4)_2S_2O_8$).

The persulfate may be included at an amount in a range of about 0.5 wt % to about 20 wt % based on the total weight of the etchant composition. When the amount of the persulfate is less than about 0.5 wt %, an etching rate of copper or a copper-based metal layer including copper decreases. Thus etching may not be performed or an etching rate may be low. When the amount of the persulfate is more than about 20 wt %, the overall etching rate increases making the etching process uncontrollable or difficult to control.

A fluorine compound may be a main ingredient that etches titanium or a titanium-based metal layer including titanium and removes residues that may be generated during etching. A fluorine compound may be used as a compound of which fluorine ions or polyatomic fluorine ions may be dissolved in a solution. For example, a fluorine compound may include at least one selected from the group consisting of ammonium fluoride, sodium fluoride, potassium fluoride, ammonium bifluoride, sodium bifluoride, and potassium bifluoride.

A fluorine compound may be included at an amount in a range of about 0.01 wt % to about 2 wt % based on the total weight of the etchant composition. When the amount of the fluorine compound is less than 0.01 wt %, the etching rate of titanium or a titanium-based metal layer including titanium decreases resulting in residue generation. When the amount of the fluorine compound is more than about 2 wt %, the glass substrate on which the metal wire is formed, and an insulating layer including silicon may be damaged.

The inorganic acid may be an auxiliary oxidizing agent for etching copper or a copper-based metal layer including copper and titanium or a titanium-based metal layer including titanium and may include at least one selected from the group consisting of nitric acid, sulfuric acid, phosphoric acid, and perchloric acid.

The inorganic acid may be included at an amount in a range of about 1 wt % to about 10 wt %, based on the total weight of the etchant composition. When the amount of the inorganic acid is less than 1 wt %, the rate of etching performed on a copper or a copper-based metal layer including copper and titanium or a titanium-based metal layer including titanium may decrease resulting in etching profile defects or generated residues. When the amount of the inorganic acid is more than 10 wt %, too much etching may occur (or be performed) or photoresist voids may be generated. Thus, short circuits may occur on the line being etched (e.g., a gate line or data line) due to invasion of the etchant.

The cyclic amine compound is an anticorrosive agent and may control the rate of etching performed on copper or copper-based metal layers including copper. The cyclic amine compound may include at least one selected from 5-aminotetrazole, imidazole, indole, purine, pyrazole, pyridine, pyrimidine, pyrrole, pyrrolidine, pyrroline, and 5-methyltetrazole.

The cyclic amine compound may be included at an amount in a range of about 0.5 wt % to about 5 wt % based on the total weight of the etchant composition. When the amount of the cyclic amine compound is less than 0.5 wt %, the rate of etching performed on copper may be uncontrollable. Thus, copper may be overly etched. When the amount of the cyclic amine compound is more than 5 wt %, the rate of etching performed on copper may decrease. Thus, the time period for the etching in the manufacturing process may increase resulting in a decrease in production efficiency.

The aliphatic sulfonic acid may prevent precipitation of a water-insoluble precipitate that may be produced by the reaction between the etchant composition and a metal ion during etching of the metal layer. The water-insoluble precipitate may be formed when copper ions that generate during etching of the copper-based metal layer react with the cyclic amine compound and the chlorine compound in the etchant composition. For example, when copper ions react with an amino group and chlorine ions, a water-insoluble precipitate may be generated and may cause equipment malfunctions leading to deteriorated process yields. For example, a waste pipe for a piece of equipment may be blocked due to the water-insoluble precipitate. In this regard, a cost for removing the water-insoluble precipitate in the equipment and the pipe may increase because the waste water needs to be treated. When the aliphatic sulfonic acid is included in the etchant composition, the sulfonic acid substitutes a part of or the whole amino group. Thus, the aliphatic sulfonic acid may prevent the generation of the water-insoluble precipitate.

The aliphatic sulfonic acid may also increase the number of substrates of the etchant composition to be treated and reduce the heat-release during the storing of the waste solution. In exemplary embodiments, the waste solution refers to an etchant composition used in the process of etching, and the storing of the waste solution refers to a state of the waste solution being stored in a storage tank. The waste solution is stored in a storage tank until a certain amount is collected. Once the appropriate amount is collected, the waste solution undergoes a waste solution treatment process. When heat is generated from the waste solution being stored in the storage tank, the risk of an accident may increase due to odor and gas generation. However, when the aliphatic sulfonic acid is included in the etchant composition, the heat generated during the waste solution storage may be reduced.

The aliphatic sulfonic acid does not include phenols, which are typically subjected to environmental regulations or scrutiny due to their hazardous properties. Thus, environmental problems may be prevented.

The aliphatic sulfonic acid may be an alkyl sulfonic acid having one to three carbons. The aliphatic sulfonic acid may be at least one selected from the group consisting of a methane sulfonic acid, an ethane sulfonic acid, and a propane sulfonic acid. Aliphatic sulfonic acids having four or more carbons (i.e., butane sulfonic acid) may generate an undesirable water-insoluble precipitate.

The aliphatic sulfonic acid (hereinafter, also referred to as "a C1-C3 alkyl sulfonic acid") may be included at an amount in a range of about 0.1 wt % to about 10 wt % based on the total weight of the etchant composition. When the amount of the C1-C3 alkyl sulfonic acid is less than 0.1 wt %, the possibility of water-insoluble precipitate generation may increase, deviation of change in critical dimension (CD) Skew per sheet of treatment may be severe, and the suppressing effect on heat generation during waste solution storage may not occur. When the amount of the C1-C3 alkyl sulfonic acid is more than 10 wt %, the etching performance of the etchant composition may not be maintained, overetching may occur due to an increased rate of etching, and the additional suppressing effect on heat generation during the waste solution storage may not occur.

The chlorine compound is an auxiliary oxidizing agent that may etch copper or a copper-based metal layer including copper. The chlorine compound may control a taper angle of the metal layer and may decrease a wire open defect ratio. Also, heat-generation during the waste solution storage may be suppressed by the chlorine compound. The chlorine compound refers to a compound that may be dissociated into chlorine ions and may include at least one selected from the group consisting of hydrochloric acid (HCl), sodium chloride (NaCl), potassium chloride (KCl), ammonium chloride ($NH_4Cl$), ethanesulfonyl chloride ($C_2H_5ClO_2S$), and methanesulfonyl chloride ($CH_3ClO_2S$).

The chlorine compound may be included at an amount in a range of about 0.1 wt % to about 5 wt % based on the total weight to the etchant composition. When the amount of the chlorine compound is less than 0.1 wt %, the rate of etching performed on copper or a copper-based metal layer including copper decreases. Thus, an etching profile may deteriorate. When the amount of the chlorine compound is more than 5 wt %, too much etching may be performed resulting in loss of some of the metal wire.

The organic acid and/or organic acid salt may be a chelating agent and may prevent an etchant from forming a compound with etched metal ions by forming a chelate complex with the metal ion due to its higher affinity to the etched metal ions. Thus, the number of sheets being treated etchant may increase. The organic acid may be at least one selected from the group consisting of nicotinic acid, acetic acid (AcOH), butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, profenic acid, iminodiacetic acid, and ethylenediaminetetraacetic acid (EDTA). The organic acid salt may include at least one selected from the group consisting of a sodium salt, a potassium salt, and an ammonium salt of the organic acid.

The organic acid and/or organic acid salt may be included at an amount in a range of about 1 wt % to about 20 wt % based on the total weight of the etchant composition. When the amount of the organic acid and/or organic acid salt is less than 1 wt %, the number of sheets to be treated by the etchant may not increase. When the amount of the organic acid or organic acid salt is more than 20 wt %, too much etching may occur (or the etching may be overly performed). Thus, short circuits may occur on the line being etched (e.g., a gate line or data line).

Water may be included in the etchant composition filling in the remaining amount of the composition to make the total weight of the etchant composition 100 wt %. The water included in the etchant composition may be deionized water.

The copper compound may maintain CD Skew when the etchant etches the metal layer. The copper compound may include at least one selected from the group consisting of a copper sulfate, a copper chlorate, and a copper nitrate.

The copper compound may be included at an amount in a range of about 0.01 wt % to about 3 wt % based on the total weight of the etchant composition. When the amount of the copper compound is less than 0.01 wt %, the ability of the etchant composition to etch with a constant CD Skew may decrease. When the amount of the copper compound is more than 3 wt %, the marginal etching ability of the etchant composition decreases. Thus, the performance (and accuracy) of the etchant may decrease.

An additional etching controlling agent, a surfactant, and a pH controlling agent may be further included in the etchant composition in addition to the materials described above.

FIGS. 1, 2, 3, and 4 are cross-sectional views sequentially illustrating a method of forming a metal wire by using an etchant composition, according to an exemplary embodiment.

Referring to FIG. 1, a metal layer may be formed on an insulating substrate INS. The metal layer may be a double layer with a first metal layer CL1 including a first metal and a second metal layer CL2 including a second metal are sequentially stacked. The first metal may be titanium and the second metal may be copper. Although the metal layer is illustrated as a double layer, exemplary embodiments are not so limited. The metal layer may be a single layer including an alloy including the first metal and the second metal or a multi-layer including at least three layers with the first metal layer CL1 and the second metal layer CL2 are alternately stacked.

Figure 2:
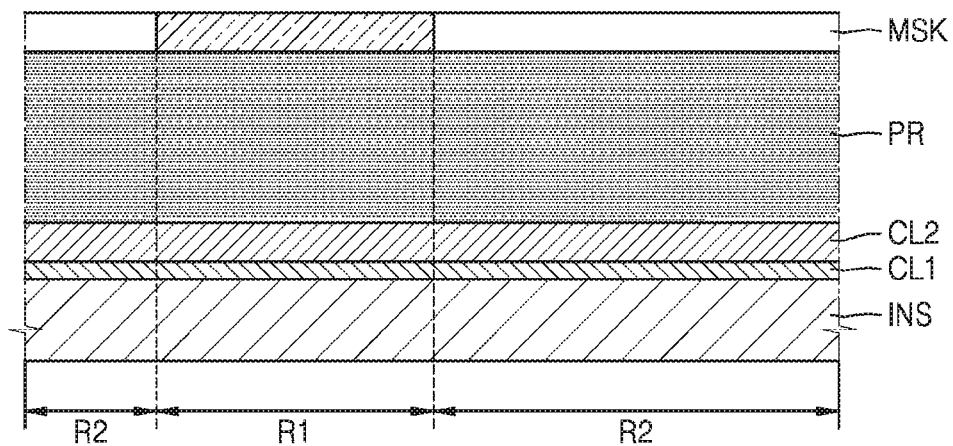

As shown in FIG. 2, a photoresist layer PR may be formed on the whole surface of the insulating layer INS. The photoresist layer PR may be exposed to light through a mask MSK after being formed on the insulating later INS. The mask MSK may include a first region R1 that completely blocks light and a second region R2 that allows a part of light to pass through. An upper surface of the insulating substrate INS may include regions that correspond to the first region R1 and the second region R2. The corresponding regions of the insulating substrate INS are also referred to as the first region R1 and the second region R2 in this application.

Figure 3:
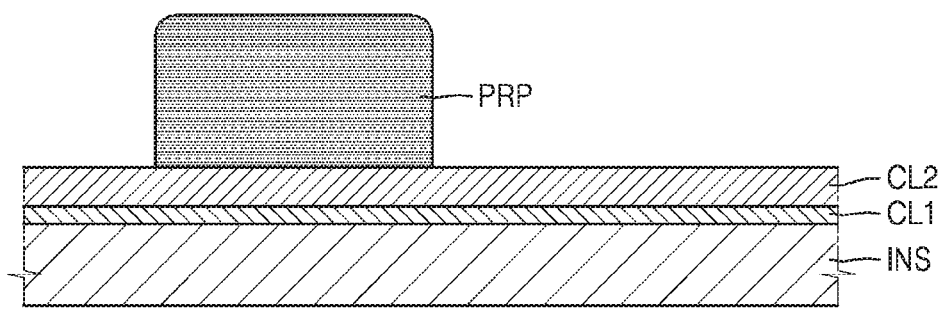

Subsequently to light exposure and as shown in FIG. 3, the photoresist layer PR may be developed leaving a photoresist layer pattern PRP having a predetermined thickness remaining on the regions where the light is completely blocked by the first region R1. Also, the photoresist layer PR may be completely removed on the second region R2 through which light passes. Thus, a surface of the insulating substrate INS may be exposed. Although FIGS. 2 and 3 show and the corresponding description above describes using a positive photoresist to remove a portion of the photoresist layer that is exposed to light, exemplary embodiments are not so limited. A negative photoresist that removes a portion of the photoresist layer that is not exposed to light may be used and is envisioned for use with any suitable exemplary embodiment.

Figure 4:
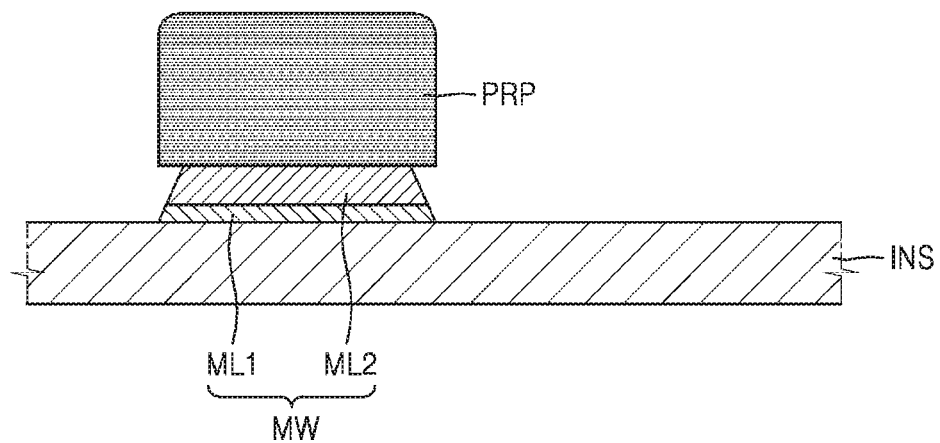

As shown in FIG. 4, the first metal layer CL1 and the second metal layer CL2 may be etched by using the photoresist layer pattern PRP as a mask. The first metal layer CL1 and the second metal layer CL2 may be etched by using the etchant composition.

As a result, a metal wire MW may be formed. The metal wire MW may include a first metal line ML1 having the first metal and a second metal line ML2 having the second metal. The second metal line ML2 may be stacked on the first metal line. The metal wire MW may have a taper shape which has a larger area at the bottom than the top. After etching the first metal layer CL1 and the second metal layer CL2, the remaining photoresist layer pattern PRP may be removed, thereby completing formation of the final metal wire MW.

Through the process described above, the metal wire MW including the first metal and the second metal may be prepared. The first metal may be titanium and the second metal may be copper or vice versa. The metal wire MW may form a gate line and/or a data line of the thin film transistor substrate.

Figure 5:
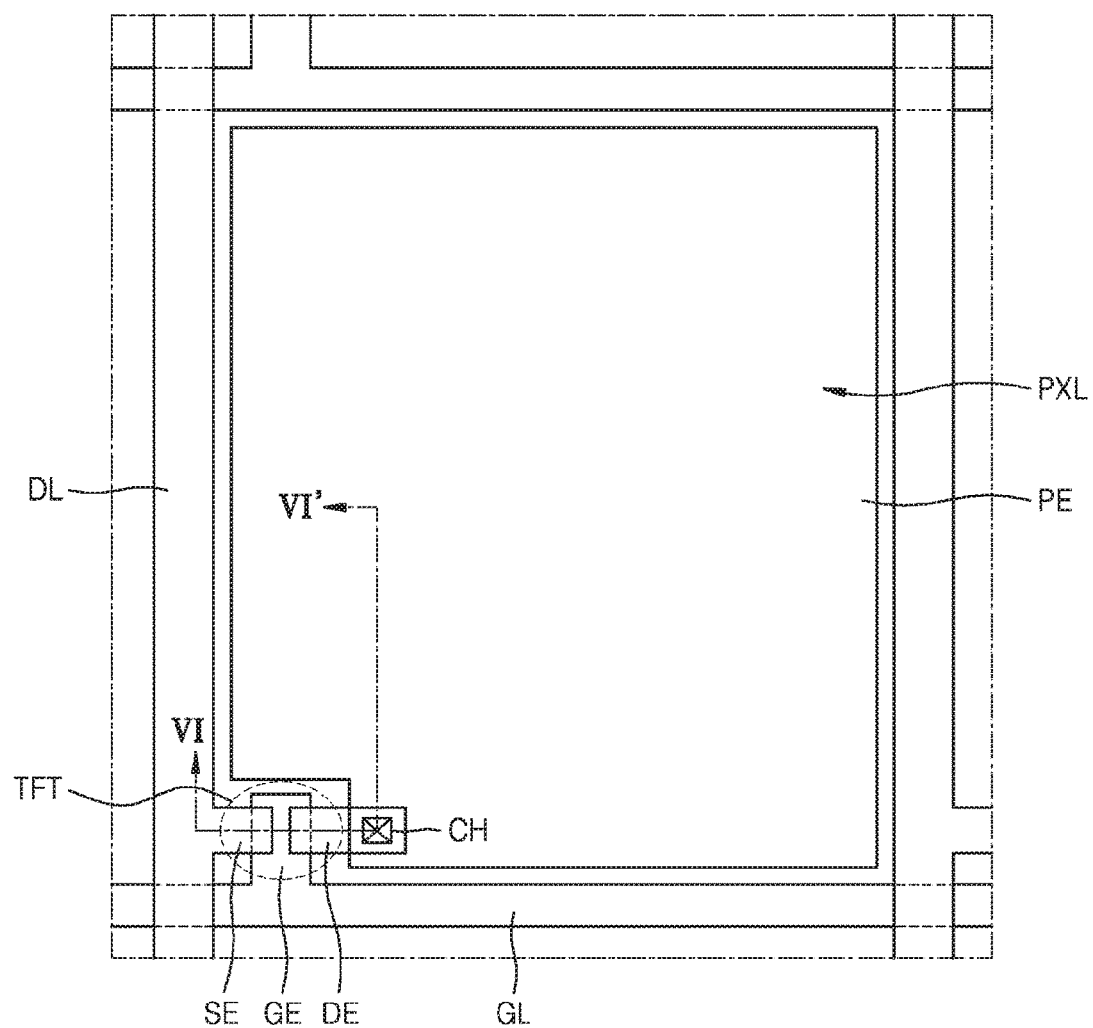
FIG. 5 is a plan view illustrating a structure of a display device including a thin film transistor prepared by using the etchant composition.
Figure 6:
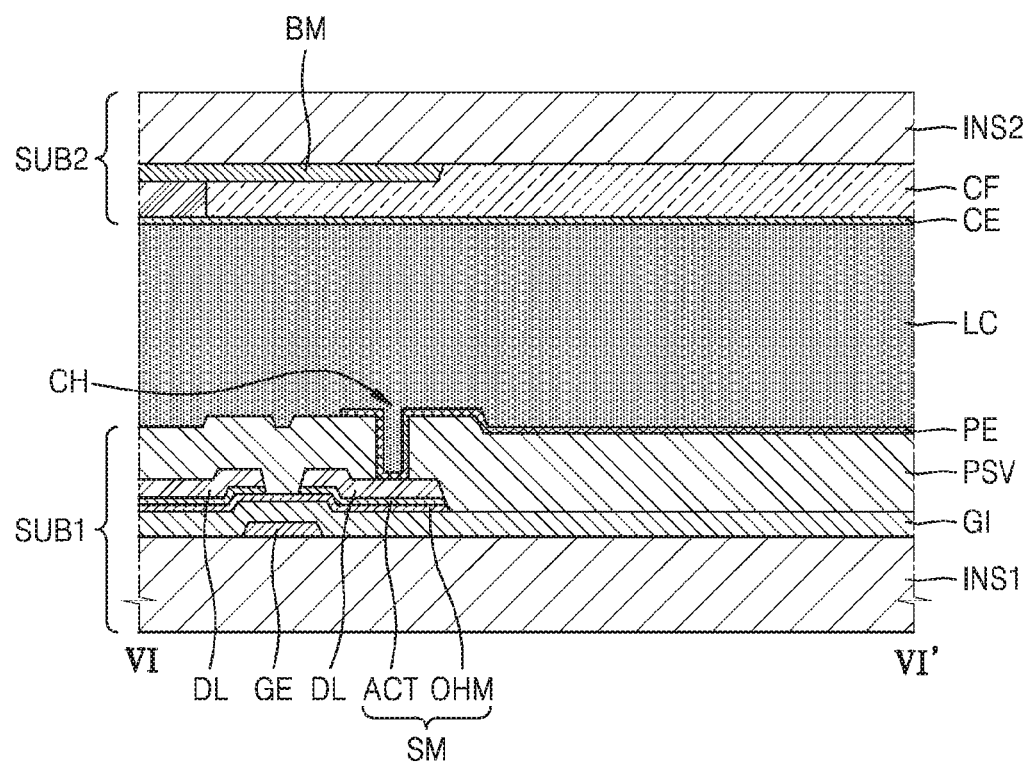
FIG. 6 is a cross-sectional view taken along a sectional line VI-VI' of FIG. 5.

FIG. 5 is a plan view illustrating a structure of a display device including a thin film transistor that may be prepared by using the etchant composition. FIG. 6 is a cross-sectional view taken along sectional line VI-VI' of FIG. 5. The thin film transistor substrate may be a thin film transistor substrate used in a display device.

A display device may have a plurality of pixels and thus may display images. In exemplary embodiments, the display device is not particularly limited. For example, the display device may include various display devices such as liquid crystal display panels, organic light emitting display apparatuses, electrophoretic display apparatuses, electrowetting display apparatuses, and microelectromechanical system (MEMS) display apparatuses. In an exemplary embodiment, the display device is a liquid crystal display panel having pixels with the same structure. Thus, for brevity and convenience to the reader and without limiting the scope of the exemplary embodiments, only one pixel and a gate line GL and a data line that are adjacent to the pixel will be described.

Referring to FIGS. 5 and 6, the display device may include a first display substrate SUB1 including a pixel PXL, a second display substrate SUB2 facing the first display substrate SUB1, and a liquid layer LC between the first display substrate SUB1 and the second display substrate SUB2. The thin film transistor substrate may be the first display substrate SUB1.

The first display substrate SUB1 may include a first insulating substrate INS1 and a plurality of gate lines GLs and a plurality of data lines DLs formed on the first insulating substrate INS1. The gate lines GLs may extend on the first insulating substrate INS1 in a first direction. The data lines DLs are formed on a gate insulating layer GI and are extended in a second direction, which crosses the first direction.

The pixel PXL may be connected to one of the gate lines GLs and one of the data lines DLs. The pixel PXL may include a thin film transistor and a pixel electrode PE that is connected to the thin film transistor.

The thin film transistor may include a gate electrode GE, a semiconductor layer SM, and a drain electrode DE.

The gate electrode GE may be a part protruded from the gate line GL extending substantially perpendicular to the direction from which the gate line GL extends.

The semiconductor layer SM may be located on the gate electrode GE with the gate insulating layer GI therebetween. The semiconductor layer SM may include an active layer ACT on the gate insulating layer GI and an ohmic contact layer OHM on the active layer ACT. The active layer ACT may be formed on an area that corresponds to a region between a source electrode SE and a drain electrode DE in a plan view. The ohmic contact layer OHM may be formed between the active layer ACT and the source electrode SE and between the active layer ACT and the drain electrode DE.

The source electrode SE may be branched from the data line DL, and, in a plan view, at least a part of the source electrode SE overlaps with the gate electrode GE. The source electrode may extend away from the data line and may extend in the same direction that the gate line extends. The drain electrode DE may be formed apart from the source electrode SE, and, in a plan view, at least a part of the drain electrode DE overlaps with the gate electrode GE.

The pixel electrode PE may be connected to the drain electrode DE with a passivation layer PSV therebetween. The passivation layer PSV may have a contact hole CH that exposes a part of the drain electrode DE. The pixel electrode PE may be connected to the drain electrode DE through the contact hole CH.

The second display substrate SUB2 may face the first display substrate SUB1. The second display substrate SUB2 may include a second insulating substrate INS2, a color filter CF formed on the second insulating substrate INS2 and configured to display color, a block matrix BM that surrounds the color filter CF and configured to block light, and a common electrode CE configured to form an electric field with the pixel electrode PE.

Figure 7:
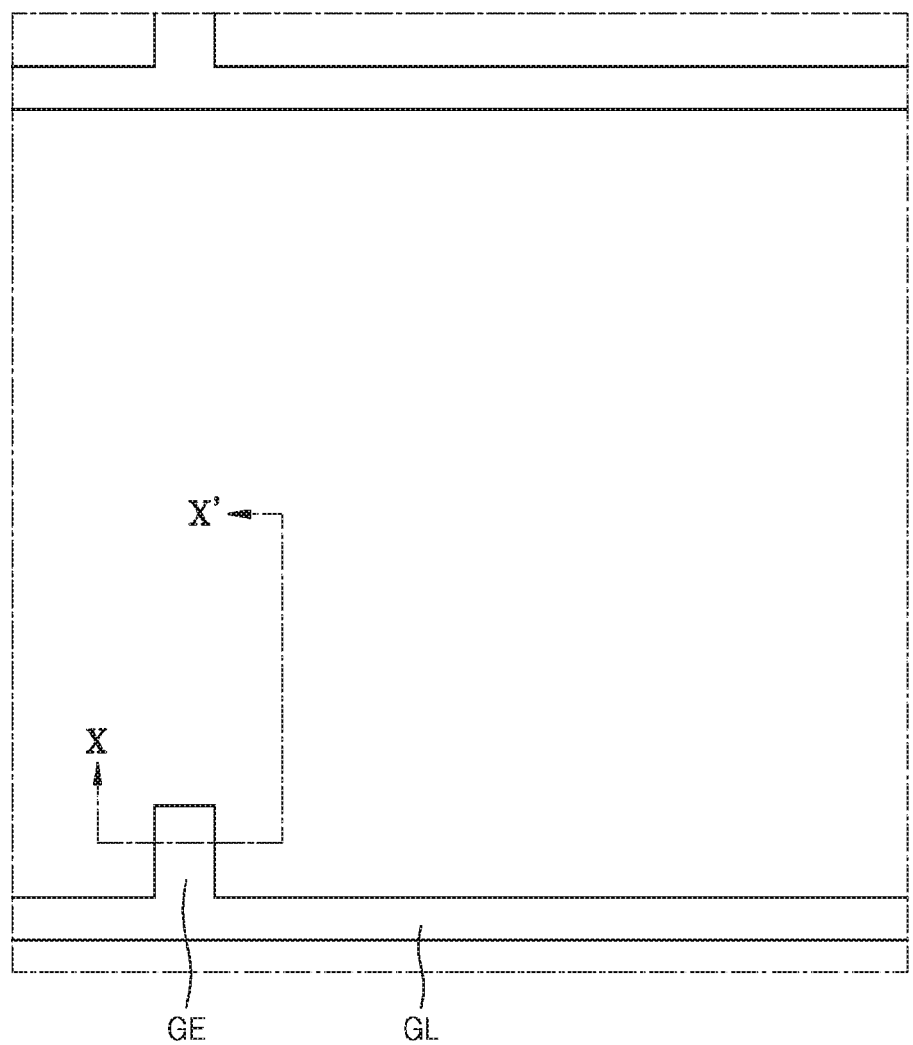
FIGS. 7, 8, and 9 are plan views sequentially illustrating a manufacturing process of a thin film transistor substrate of the display device shown in FIG. 5.
Figure 8:
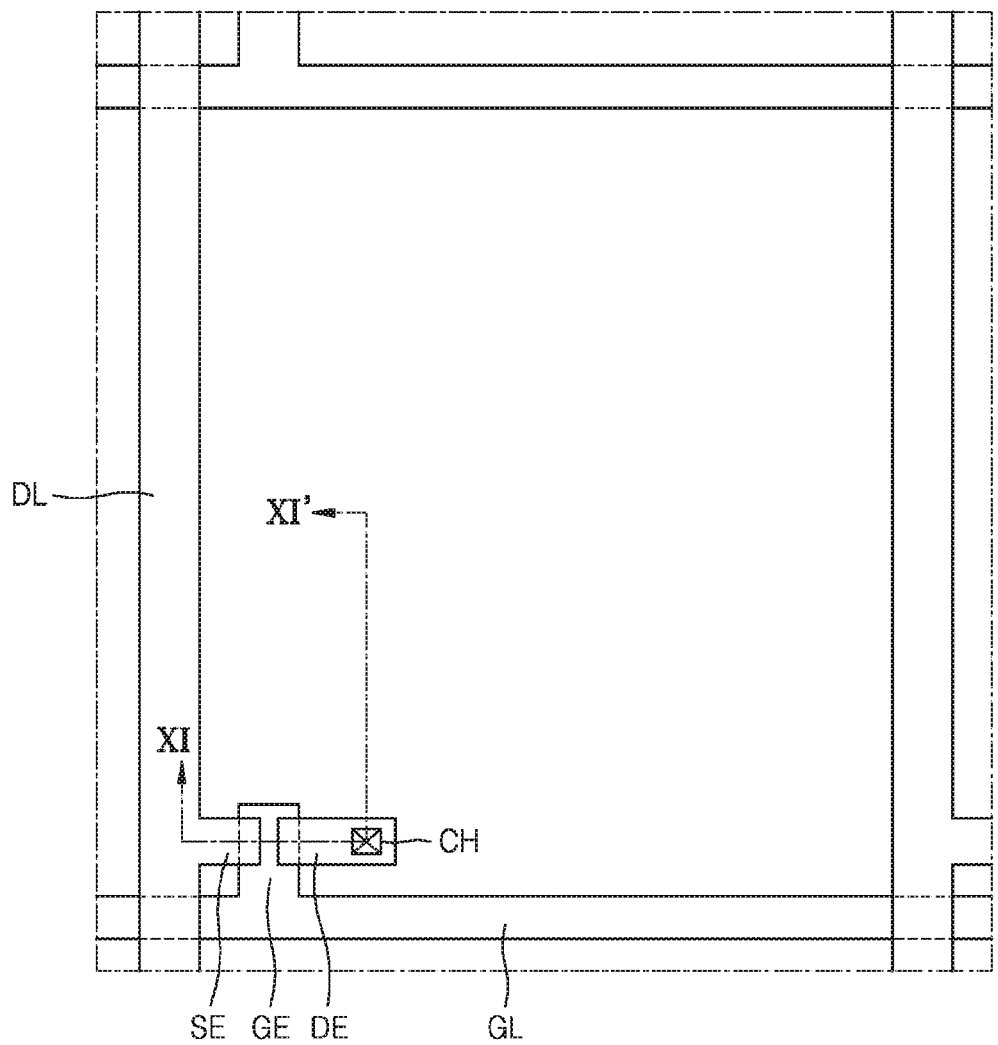
Figure 9:
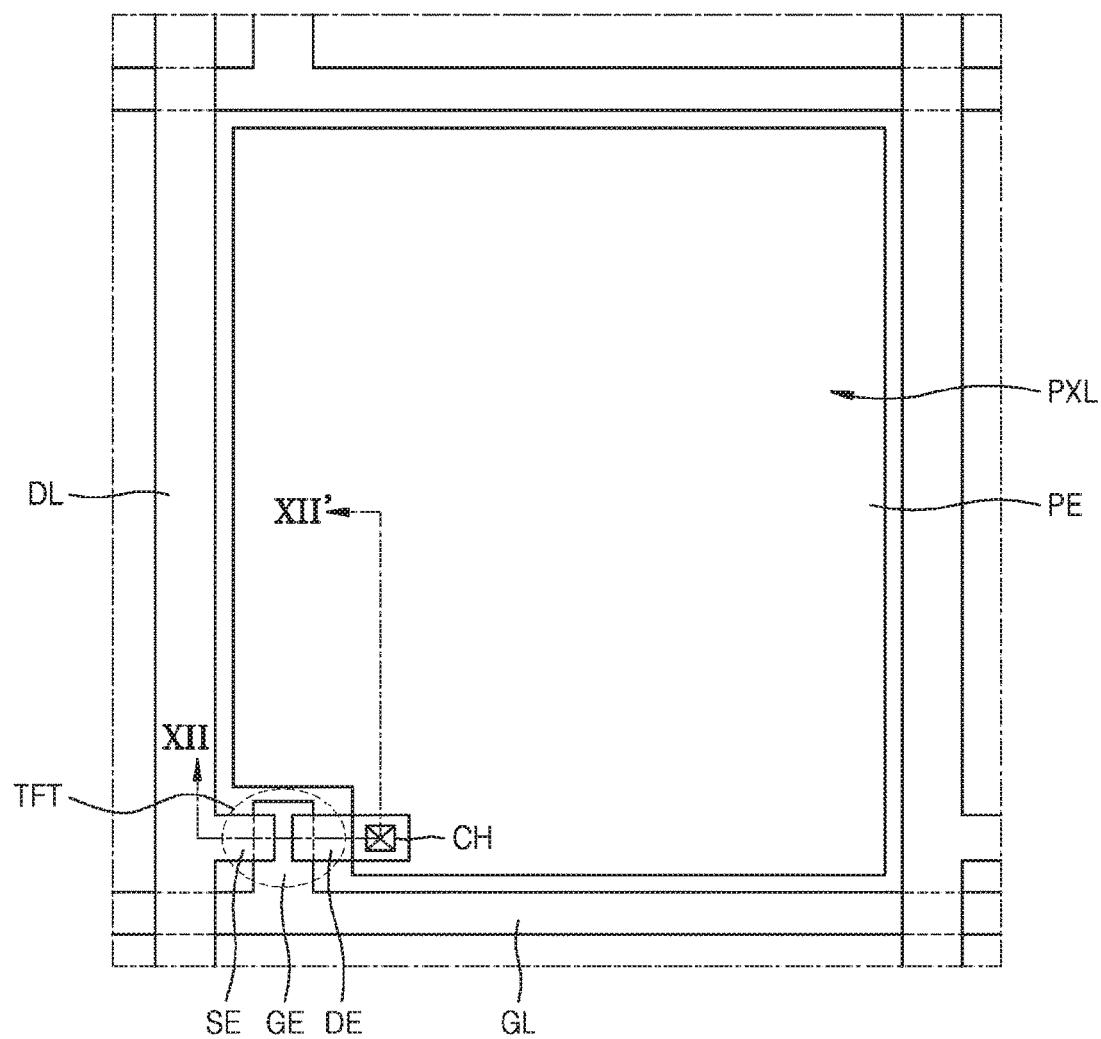
Figure 10:
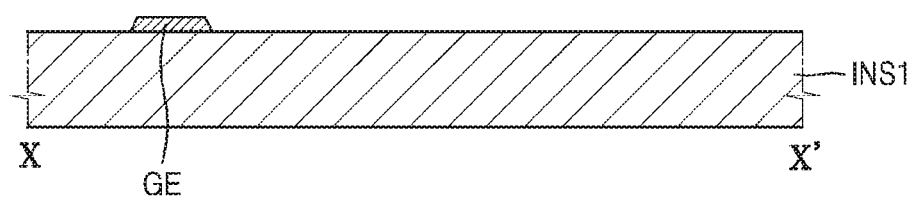
FIGS. 10, 11, and 12 are cross-sectional views taken along sectional lines X-X', XI-XI', and XII-XII' of FIGS. 7, 8, and 9, respectively.
Figure 11:
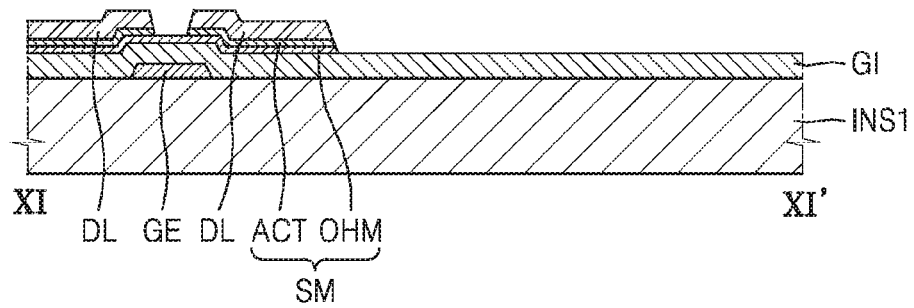
Figure 12:
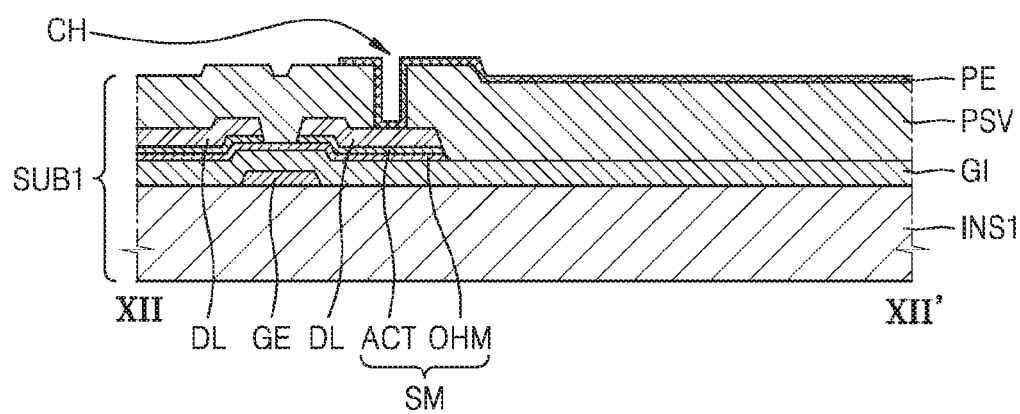

FIGS. 7, 8, and 9 are plan views sequentially illustrating a manufacturing process of a thin film transistor substrate of the display device shown in FIGS. 5 and 6. FIGS. 10, 11, and 12 are cross-sectional views taken along sectional lines X-X', XI-XI', and XII-XII' of FIGS. 7, 8, and 9, respectively.

A method of manufacturing a display device according to an exemplary embodiment will be described by referring to FIGS. 7, 8, 9, 10, 11, and 12.

Referring to FIGS. 7 and 10, a first line part may be formed on the first insulating substrate INS1. The first line part may include the gate line GL extended in the first direction and the gate electrode GE connected to the gate line GL.

The first line part may be formed by forming a first metal layer on the first insulating substrate INS1 and etching the first metal layer by using a photolithography process. The first metal layer may be formed by sequentially stacking a first layer and a second layer on the first insulating substrate INS1. The first layer and the second layer may be formed of different materials. The first layer may be formed of titanium and/or a titanium-based metal including titanium. The second layer may be formed of copper and/or a copper-based metal including copper.

The first layer and the second layer may be etched simultaneously by using the etchant composition according to an exemplary embodiment. The first line part may be etched so that a taper angle may be in a range of about 25 degrees to about 50 degrees. The taper angle may denote an angle that is formed by a side surface of the first line part and an upper surface of the first insulating substrate INS1. In this regard, the gate line GL and the gate electrode GE may be formed in a double layer structure having the sequentially stacked first layer and second layer.

Referring to FIGS. 8 and 11, the gate insulating layer GI may be formed on the first insulating substrate INS1. The semiconductor layer SM and a second line part may be formed on the gate insulating layer GI.

The gate insulating layer GI may be formed by stacking a first insulating material on the first insulating substrate INS1. The semiconductor layer SM may be formed by sequentially stacking a first semiconductor material and a second semiconductor material on the first insulating substrate INS1 and patterning the first and second semiconductor materials. The first semiconductor material may form the active layer ACT and the second semiconductor material may form the ohmic contact layer.

The second line part may include the data line DL that is extended in the second direction. The second direction crosses the first direction (e.g., the direction that the gate line GL is extended). The second line part may also include the source electrode SE, which may be connected to the data line DL, and the drain electrode DE that is separated apart from the source electrode SE.

The second line part may be formed by forming a second metal layer on the gate insulating layer GI and etching the second metal layer with photolithography. The second metal layer, as well as the first metal layer, may include a first layer that is formed of titanium or a titanium-based metal including titanium and a second layer that is formed of copper or a copper-based metal including copper. The first layer and the second layer of the first and second metal layers may be sequentially stacked. The second metal layer may etched by using the same etchant composition that is used in etching the first metal layer. Therefore, the second line part may also be formed in a double layer structure including the sequentially stacked first layer and second layer.

Referring to FIGS. 9 and 12, a passivation layer PSV may be formed on the second line part. A pixel electrode PE may be formed on the passivation layer PSV.

The passivation layer PSV may have a contact hole CH that exposes a part of the drain electrode DE. The passivation layer PSV may be formed by stacking a second insulating material layer and a photoresist layer on the first insulating substrate INS1, forming a photoresist layer pattern by exposing the photoresist layer to light and developing the photoresist layer, and removing apart of the second insulating material layer by using the photoresist layer pattern as a mask.

The pixel electrode PE may be connected to the drain electrode DE through the contact hole CH. The pixel electrode PE may be formed by sequentially stacking a transparent conductive material layer (not shown) and a photoresist layer (not shown) on the first insulating substrate INS1, forming a photoresist layer pattern (not shown) by exposing the photoresist layer to light and developing the photoresist layer, and patterning the transparent conductive material layer by using the photoresist layer pattern as a mask.

The prepared thin film transistor substrate may include a first display substrate SUB1 attached to the second display substrate SUB2 with a color filter layer. A liquid crystal layer LC may be formed between the first display substrate SUB1 and the second display substrate SUB2.

Thereinafter, one or more embodiments of the inventive concept may be described in detail with reference to the following examples. However, these examples are not intended to limit the scope of the one or more embodiments of the inventive concept. It will be understood by one of ordinary skill in the art that modifications may be made to the one or more exemplary embodiments without departing from the spirit and scope of the inventive concept.

Preparation of Etchant Composition

Etchant compositions were prepared by mixing ingredients at the corresponding amounts shown in Table 1. A unit of each of the amounts is wt %, SPS denotes persulfate, ABF denotes ammonium bifluoride, ATZ denotes 5-aminotetrazole, and p-TSA denotes para-toluenesulfonic acid.

TABLE 2

|  | Phenol | Water-insoluble precipitate |
|---|---|---|
| Example 1 | Not detected | Not generated |
| Example 11 | Not detected | Not generated |
| Example 12 | Not detected | Not generated |
| Comparative Example 1 | Not detected | Generated |
| Comparative Example 6 | Not detected | Generated |
| Comparative Example 7 | Not detected | Generated |
| Comparative Example 8 | Detected | Generated |

TABLE 1

|  | SPS | ABF | Nitric acid | ATZ | NaCl | AcOH | pTSA | Sulfamic acid | Methane sulfonic acid | Ethane sulfonic acid | Propane sulfonic acid | Butane sulfonic acid | Water |
|---|---|---|---|---|---|---|---|---|---|---|---|---|---|
| Example 1 | 15 | 0.5 | 3.0 | 1.3 | 1 | 3 | — | — | 2 | — | — | — | Remaining amount |
| Example 2 | 15 | 0.5 | 3.0 | 1.3 | 1 | 3 | — | — | 0.1 | — | — | — | Remaining amount |
| Example 3 | 15 | 0.5 | 3.0 | 1.3 | 1 | 3 | — | — | 5 | — | — | — | Remaining amount |
| Example 4 | 15 | 0.5 | 3.0 | 1.3 | 1 | 3 | — | — | 7 | — | — | — | Remaining amount |
| Example 5 | 15 | 0.5 | 3.0 | 1.3 | 1 | 3 | — | — | 10 | — | — | — | Remaining amount |
| Example 6 | 15 | 0.5 | 3.0 | 1.3 | 1 | 1 | — | — | 2 | — | — | — | Remaining amount |
| Example 7 | 15 | 0.5 | 3.0 | 1.3 | 1 | 5 | — | — | 2 | — | — | — | Remaining amount |
| Example 8 | 15 | 0.5 | 3.0 | 1.3 | 1 | 8 | — | — | 2 | — | — | — | Remaining amount |
| Example 9 | 15 | 0.5 | 3.0 | 1.3 | 1 | 12 | — | — | 2 | — | — | — | Remaining amount |
| Example 10 | 15 | 0.5 | 3.0 | 1.3 | 1 | 20 | — | — | 2 | — | — | — | Remaining amount |
| Example 11 | 15 | 0.5 | 3.0 | 1.3 | 1 | 3 | — | — | — | 2 | — | — | Remaining amount |
| Example 12 | 15 | 0.5 | 3.0 | 1.3 | 1 | 3 | — | — | — | — | 2 | — | Remaining amount |
| Comparative Example 1 | 15 | 0.5 | 3.0 | 1.3 | 1 | 3 | — | — | — | — | — | — | Remaining amount |
| Comparative Example 2 | 15 | 0.5 | 3.0 | 1.3 | 1 | 3 | — | — | 12 | — | — | — | Remaining amount |
| Comparative Example 3 | 15 | 0.5 | 3.0 | 1.3 | 1 | — | — | — | — | — | — | — | Remaining amount |
| Comparative Example 4 | 15 | 0.5 | 3.0 | 1.3 | 1 | 22 | — | — | 2 | — | — | — | Remaining amount |
| Comparative Example 5 | 15 | 0.5 | 3.0 | 1.3 | 1 | 20 | — | — | — | — | — | — | Remaining amount |
| Comparative Example 6 | 15 | 0.5 | 3.0 | 1.3 | 1 | 3 | — | 2 | — | — | — | — | Remaining amount |
| Comparative Example 7 | 15 | 0.5 | 3.0 | 1.3 | 1 | 3 | — | — | — | — | — | 2 | Remaining amount |
| Comparative Example 8 | 15 | 0.5 | 3.0 | 1.3 | 1 | 3 | 2 | — | — | — | — | — | Remaining amount |

Detection of Phenol and Generation of Water-Insoluble Precipitate

Table 2 shows whether phenol was detected and whether a water-insoluble precipitate was generated during an etching process of a metal including copper by using the etchant compositions of Examples 1, 11, and 12 and Comparative Examples 1, 6, 7, and 8. The generation of a water-insoluble precipitate was determined by observing generation of a water-insoluble precipitate after dissolving 3000 ppm of copper in the etchant composition in Table 2 and storing the solution at a low temperature of −9 Celsius for 90 days.

As shown in Table 2, the etchant composition not including a C1-C3 alkyl sulfonic acid as prepared in Comparative Example 1 and the etchant composition including a cyclic sulfonic acid as prepared in Comparative Example 8 had a water-insoluble precipitate generated during metal etching process. Also, phenol, which is a material subjected to environmental regulations due to its toxicity and other dangerous properties, was detected from the case of the etchant composition including a cyclic sulfonic acid as prepared in Comparative Example 8.

However, phenol was not detected in etchant compositions including a non-cyclic sulfonic acid as prepared in Example 1, 11, and 12 and Comparative Examples 1, 6 and 7. A water-insoluble precipitate was generated in the case of the etchant composition including sulfamic acid as prepared in Comparative Example 6. Also, a water-insoluble precipitate was generated in the case of the etchant composition including butane sulfonic acid, which is an aliphatic sulfonic acid but has four carbons, as prepared in Comparative Example 7.

It may be known that phenol was not detected and a water-insoluble precipitate was not generated during metal etching process from the cases of the etchant compositions including a C1-C3 alkyl sulfonic acid as prepared in Examples 1, 11, and 12.

Evaluation of Etching Ability

Table 3 shows the results of evaluating etching abilities of the etchant compositions prepared in Examples 1, 2, 3, 4, 5, 6, 7, 8, 9, 10, 11, and 12 and Comparative Examples 1, 2, 3, 4, 5, 6, and 7 of Table 1. The evaluation of etching ability of the etchant compositions was performed by a reference etch test of a titanium/copper metal layer. After adding a predetermined amount of a copper powder to each of the etchant compositions, the mixture was determined as a defect when a CD Skew value exceeded ±10% of a CD Skew value of the reference etch test. The accumulated copper concentrations at that point are shown in Table 3. Here, a CD Skew value of the reference etch test denotes a CD Skew value when no copper powder was added (Cu 0 ppm). As shown in Table 3, when an accumulated copper concentration increased, the number of substrates being etched increased accordingly.

TABLE 3

| | Accumulated Cu concentration (ppm) |
|---|---|
| Example 1 | 3500 |
| Example 2 | 2500 |
| Example 3 | 4500 |
| Example 4 | 5000 |
| Example 5 | 5000 |
| Example 6 | 3500 |
| Example 7 | 4000 |
| Example 8 | 4500 |
| Example 9 | 5000 |
| Example 10 | 5500 |
| Example 11 | 3000 |
| Example 12 | 3000 |
| Comparative Example 1 | 2000 |
| Comparative Example 2 | Overly etched |
| Comparative Example 3 | 1500 |
| Comparative Example 4 | Overly etched |
| Comparative Example 5 | Overly etched |
| Comparative Example 6 | 2500 |
| Comparative Example 7 | 2000 |

In Table 3, an accumulated Cu concentration of Example 1 including 2 wt % of methane sulfonic acid was 3500 ppm, an accumulated Cu concentration of Example 11 including 2 wt % of ethane sulfonic acid was 3000 ppm, and an accumulated Cu concentration of Example 12 including 2 wt % of propane sulfonic acid was 3000 ppm. In this regard, the etchant compositions including methane sulfonic acid, ethane sulfonic acid, and propane sulfonic acid are shown to have about the same etching ability.

Referring to Examples 2, 3, 4, and 5 of Table 3, the accumulation of Cu concentration increases as an amount of methane sulfonic acid increases. In other words, the number of sheets of substrate treatment may increase according to an amount of C1-C3 alkyl sulfonic acid.

However, as shown in Comparative Example 2, when an amount of methane sulfonic acid included in the etchant composition was higher than 10 wt %, an etching rate increased so much that the metal was overly etched. Furthermore, as shown in Example 2 and Comparative Examples 1 and 3, when an amount of methane sulfonic acid included in the etchant composition was lower than 0.1 wt %, the accumulated Cu concentration was lower than 2500 ppm. Thus, an etching ability of the composition deteriorates in Example 2 and Comparative Examples 1 and 3. In this regard, a conventional cyclic sulfonic acid may not be prepared.

Also, the etchant compositions prepared in Comparative Example 6 including sulfamic acid and Comparative Example 7 including butane sulfonic acid had a relatively lower accumulated Cu concentration compared to the etchant composition including a C1-C3 alkyl sulfonic acid.

Therefore, it is shown that when the etchant composition includes a C1-C3 alkyl sulfonic acid at an amount in a range of about 0.1 wt % to about 10 wt % based on the total weight of the etchant composition, the number of treatment sheets of the substrate increases.

As shown in Examples 6, 7, 8, 9, and 10 of Table 3, it is shown that an accumulated Cu concentration increases as an amount of acetic acid increases. However, as shown in Comparative Example 4, when the amount of acetic acid is higher than 20 wt %, the metal may be overly etched. Thus, a suitable amount of an organic acid and/or an organic acid salt may be about 20 wt % or less based on the total weight of the etchant composition.

Also, as shown in Table 3, the etchant composition of Example 10 includes methane sulfonic acid in addition to the etchant composition of Comparative Example 5. However, the metal was over etched by using the etchant composition of Comparative Example 5 and was not over etched with the etchant composition of Example 10. In other words, when increasing an amount of an organic acid and/or an organic acid salt to the etchant composition to increase the number of treatment sheets of the substrate, a C1-C3 alkyl-sulfonic acid may be added to the etchant composition to prevent over-etching.

Table 4 shows CD skew values at the beginning of etching of the metal layer when a copper compound is further included in the etchant composition of Example 1 of Table 1. In particular, Example 13 of Table 4 is an etchant composition further including 0.2 wt % of copper sulfate in the etchant composition of Example 1 of Table 1. Table 4 shows CD Skew values according to Cu concentration.

TABLE 4

| | Cu concentration | | | | | Phenol | Water-insoluble precipitate |
|---|---|---|---|---|---|---|---|
| | 0 ppm | 100 ppm | 200 ppm | 300 ppm | 500 ppm | | |
| Example 1 | 0.92 um | 0.91 um | 0.80 um | 0.88 um | 0.91 um | Not detected | Not generated |
| Example 13 | 0.91 um | 0.91 um | 0.90 um | 0.91 um | 0.90 um | Not detected | Not generated |

As shown in Table 4, the etchant compositions of Example 1 and Example 13 both include a C1-C3 alkylsulfonic acid, and thus phenol was not detected during etching of the metal, and no water-insoluble precipitate was generated.

Also, as shown in Table 4, it is shown that when the etchant composition prepared in Example 13 including a copper compound was used a CD Skew value did not change during etching of a metal layer and maintained stability when compared to Example 1 without the copper compound. The copper compound may include at least one selected from the group consisting of a copper sulfate, a copper chlorate, and a copper nitrate. The amount of the copper compound in the etchant composition may be in a range of about 0.01 wt % to about 3 wt % based on the total weight of the etchant composition.

As described above, according to various exemplary embodiments, an etchant composition may suppress the generation of a water-insoluble precipitate occurring during etching of a metal layer by including a C1-C3 alkyl sulfonic acid. In this regard, wiring defects, cost for removing precipitates in equipment and pipes, waste water treatment, and deterioration in process yield caused by the water-insoluble precipitate may be prevented. Also, the number of treatment sheets of the substrate increases, heat-release may be suppressed, and environmental issues may be prevented as phenol and its derivatives are not included.

The etchant composition according to various exemplary embodiments may be used in preparation of a memory semiconductor display panel as well as preparation of a flat display, such as a liquid crystal display device. Also, the etchant composition may be utilized in the manufacture of other electronic devices including a metal wire having a single layer of a titanium-based metal layer or a double layer of a titanium-based metal layer/a copper-based metal layer.

As described above, according to various exemplary embodiments, an environmentally friendly etchant composition with excellent etching characteristics water-insoluble precipitate prevention characteristics is provided along with a method of preparing a thin film transistor substrate by using the etchant composition.

The etchant composition may be also used in the manufacture of a memory semiconductor display board as well as a flat display such as a liquid crystal display panel. Also, the etchant composition may be used in manufacture of other electronic devices that include a metal wire formed of a single layer of a titanium-based metal layer or a double layer of a titanium-based metal layer/a copper-based metal layer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An etchant composition, comprising:
    about 0.5 wt % to about 20 wt % of persulfate,
    about 0.01 wt % to about 2 wt % of a fluorine compound,
    about 1 wt % to about 10 wt % of an inorganic acid,
    about 0.5 wt % to about 5 wt % of a cyclic amine compound,
    about 0.1 wt % to about 5 wt % of a chlorine compound,
    about 0.1 wt % to about 10 wt % of an aliphatic sulfonic acid,
    about 1 wt % to about 20 wt % of an organic acid or an organic acid salt, and water;
    wherein the wt % is based on a total weight of the etchant composition,
    wherein the aliphatic sulfonic acid comprises at least one selected from the group consisting of methanesulfonic acid, ethanesulfonic acid, and propanesulfonic acid, and
    wherein the cyclic amine compound comprises 5-methyltetrazole, and
    wherein the etchant composition simultaneous etches of a double layer comprising a titanium-based metal layer and a copper-based metal layer.

2. The etchant composition of claim 1, wherein the persulfate is at least one selected from the group consisting of potassium persulfate, sodium persulfate, and ammonium persulfate.

3. The etchant composition of claim 1, wherein the fluorine compound is at least one selected from the group consisting of ammonium fluoride, sodium fluoride, potassium fluoride, ammonium bifluoride, sodium bifluoride, and potassium bifluoride.

4. The etchant composition of claim 1, wherein the inorganic acid is at least one selected from the group consisting of nitric acid, sulfuric acid, phosphoric acid, and perchloric acid.

5. The etchant composition of claim 1, wherein the chlorine compound is at least one selected from the group consisting of hydrochloric acid, sodium chloride, potassium chloride, ammonium chloride, ethane sulfonyl chloride, and methanesulfonyl chloride.

6. The etchant composition of claim 1, wherein the etchant composition comprises the organic acid, and
    wherein the organic acid is at least one selected from the group consisting of nicotinic acid, acetic acid, butanoic acid, citric acid, formic acid, gluconic acid, glycolic acid, malonic acid, oxalic acid, pentanoic acid, sulfobenzoic acid, sulfosuccinic acid, sulfophthalic acid, salicylic acid, sulfosalicylic acid, benzoic acid, lactic acid, glyceric acid, succinic acid, malic acid, tartaric acid, isocitric acid, propenic acid, iminodiacetic acid, and ethylenediaminetetraacetic acid.

7. The etchant composition of claim 1, wherein the etchant composition comprises the organic acid salt, and
    wherein the organic acid salt is at least one selected from the group consisting of a potassium salt of nicotinic acid, a potassium salt of acetic acid, a potassium salt of butanoic acid, a potassium salt of citric acid, a potassium salt of formic acid, a potassium salt of gluconic acid, a potassium salt of glycolic acid, a potassium salt of malonic acid, a potassium salt of oxalic acid, a potassium salt of pentanoic acid, a potassium salt of sulfobenzoic acid, a potassium salt of sulfosuccinic acid, a potassium salt of sulfophthalic acid, a potassium salt of salicylic acid, a potassium salt of sulfosalicylic acid, a potassium salt of benzoic acid, a potassium salt of lactic acid, a potassium salt of glyceric acid, a potassium salt of succinic acid, a potassium salt of malic acid, a potassium salt of tartaric acid, a potassium salt of isocitric acid, a potassium salt of propenic acid, a potassium salt of iminodiacetic acid, a potassium salt of ethylenediaminetetraacetic acid, a sodium salt of nicotinic acid, a sodium salt of acetic acid, a sodium salt of butanoic acid, a sodium salt of citric acid, a sodium salt of formic acid, a sodium salt of gluconic acid, a sodium salt of glycolic acid, a sodium salt of malonic acid, a sodium salt of oxalic acid, a sodium salt of pentanoic acid, a sodium salt of sulfobenzoic acid, a sodium salt of sulfosuccinic acid, a sodium salt of sulfophthalic acid, a sodium salt of salicylic acid, a sodium salt of sulfosalicylic acid, a sodium salt of benzoic acid, a sodium salt of lactic acid, a sodium salt of glyceric acid, a sodium salt of succinic acid, a sodium salt of malic acid, a sodium salt of tartaric acid, a sodium salt of isocitric acid, a sodium salt of propenic acid, a sodium salt of iminodiacetic acid, a sodium salt of ethylenediaminetetraacetic acid, an ammonium salt of nicotinic acid, an ammonium salt of acetic acid, an ammonium salt of butanoic acid, an ammonium salt of citric acid, an ammonium salt of formic acid, an ammonium salt of gluconic acid, an ammonium salt of glycolic acid, an ammonium salt of malonic acid, an ammonium salt of oxalic acid, an ammonium salt of pentanoic acid, an ammonium salt of sulfobenzoic acid, an ammonium salt of sulfosuccinic acid, an ammonium salt of sulfophthalic acid, an ammonium salt of salicylic acid, an ammonium salt of sulfosalicylic acid, an ammonium salt of benzoic acid, an ammonium salt of lactic acid, an ammonium salt of glyceric acid, an ammonium salt of succinic acid, an ammonium salt of malic acid, an ammonium salt of tartaric acid, an ammonium salt of isocitric acid, an ammonium salt of propenic acid, an ammonium salt of iminodiacetic acid, and an ammonium salt of ethylenediaminetetraacetic acid.

8. The etchant composition of claim 1, further comprising about 0.01 wt % to about 3 wt % of a copper compound, wherein the copper compound is selected from the group consisting of a copper sulfate, a copper chlorate, and a copper nitrate.

9. A method of manufacturing a thin film transistor substrate, the method comprising:
    forming a first line part comprising a gate line and a gate electrode connected to the gate line by sequentially forming a first metal layer on a first insulating substrate and etching a part of the first metal layer with an etchant composition;
    forming a gate insulating layer on the first insulating substrate;
    forming a second line part comprising a data line, a source electrode connected to the data line, and a drain electrode separated from the source electrode by forming a second metal layer on the gate insulating layer and etching a part of the second metal layer with the etchant composition;
    forming a passivation layer on the second line part; and
    forming a pixel electrode connected to the drain electrode on the passivation layer,
    wherein the first metal layer and the second metal layer comprise a first layer comprising titanium and the first metal layer and the second metal layer comprise a second layer comprising copper,
    wherein the etchant composition comprises about 0.5 wt % to about 20 wt % of persulfate, about 0.01 wt % to about 2 wt % of a fluoride compound, about 1 wt % to about 10 wt % of an inorganic acid, about 0.5 wt % to about 5 wt % of a cyclic amine compound, about 0.1 wt % to about 5 wt % of a chlorine compound, about 0.1 wt % to about 10 wt % of an aliphatic sulfonic acid, about 1 wt % to about 20 wt % of an organic acid or an organic acid salt, and water, wherein the wt % is based on a total weight of the etchant composition,
    wherein the aliphatic sulfonic acid comprises at least one selected from the group consisting of methanesulfonic acid, ethanesulfonic acid, and propanesulfonic acid, and
    wherein the cyclic amine compound comprises 5-methyltetrazole, and
    wherein the first layer and the second layer are simultaneously etched.

10. The method of claim 9, wherein the thin film transistor substrate further comprises about 0.01 wt % to about 3 wt % of a copper compound, wherein the copper compound is at least one selected from a copper sulfate, a copper cholate, a copper nitrate.

11. An etchant composition, comprising:
    about 0.5 wt % to about 20 wt % of persulfate,
    about 0.01 wt % to about 2 wt % of a fluorine compound,
    about 1 wt % to about 10 wt % of an inorganic acid,
    about 0.5 wt % to about 5 wt % of a cyclic amine compound,
    about 0.1 wt % to about 5 wt % of a chlorine compound,
    about 0.1 wt % to about 10 wt % of an aliphatic sulfonic acid,
    about 1 wt % to about 20 wt % of an organic acid or an organic acid salt, and water as a remaining amount;
    wherein the wt % is based on a total weight of the etchant composition,
    wherein the aliphatic sulfonic acid comprises at least one selected from the group consisting of ethanesulfonic acid and propanesulfonic acid, and
    wherein the cyclic amine compound comprises 5-methyltetrazole.

* * * * *